US009779825B2

(12) United States Patent
Tailliet et al.

(10) Patent No.: US 9,779,825 B2
(45) Date of Patent: Oct. 3, 2017

(54) METHOD FOR READING AN EEPROM AND CORRESPONDING DEVICE

(71) Applicant: STMicroelectronics (Rousset) SAS, Rousset (FR)

(72) Inventors: François Tailliet, Fuveau (FR); Marc Battista, Marseilles (FR); Victorien Brecte, Aix-en-Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/183,515

(22) Filed: Jun. 15, 2016

(65) Prior Publication Data

US 2017/0125112 A1    May 4, 2017

(30) Foreign Application Priority Data

Nov. 3, 2015   (FR) .................................... 15 60515

(51) Int. Cl.
*G11C 16/26*   (2006.01)
*G11C 16/04*   (2006.01)
*G11C 16/24*   (2006.01)

(52) U.S. Cl.
CPC .......... *G11C 16/26* (2013.01); *G11C 16/0433* (2013.01); *G11C 16/24* (2013.01)

(58) Field of Classification Search
CPC ................ G11C 11/5642; G11C 16/28; G11C 2211/5634
See application file for complete search history.

(56) References Cited

U.S. PATENT DOCUMENTS

| 9,025,386 B1 | 5/2015 | Iyer et al. |
| 9,082,500 B1 | 7/2015 | Ku |
| 2008/0062762 A1* | 3/2008 | Doyle ................. G11C 11/5642 365/185.11 |
| 2016/0071594 A1* | 3/2016 | Paudel ................... G11C 16/10 365/185.11 |

FOREIGN PATENT DOCUMENTS

WO    2009051960 A1    4/2009

* cited by examiner

*Primary Examiner* — Tuan T Nguyen
(74) *Attorney, Agent, or Firm* — Slater Matsil, LLP

(57) ABSTRACT

One embodiment provides a method for reading a memory cell of a memory plane of a memory of the erasable electrically-programmable ROM type. The word line and of the bit line to which the memory cell belongs are selected and the content of the cell is read via a read amplifier. One input of the read amplifier is connected to the bit line and pre-charged at a pre-charge voltage. During the read operation, a source voltage higher than the pre-charge voltage is applied to the source of the floating-gate transistor of the cell. A read current flows from the cell towards the input of the read amplifier and then flows through a programmed cell.

13 Claims, 2 Drawing Sheets

METHOD FOR READING AN EEPROM AND CORRESPONDING DEVICE

This application claims priority to French Patent Application No. 1560515, filed on Nov. 3, 2015, which application is hereby incorporated herein by reference.

TECHNICAL FIELD

Various embodiments of the invention relate to memories, in particular non-volatile memories of the electrically erasable and programmable type (EEPROM).

BACKGROUND

In EEPROM memories, the logical value of a bit is stored in a memory cell, comprising a state transistor and a selection transistor.

The state transistor is generally a floating-gate transistor, comprising a control gate and a floating gate, and the information is expressed as a function of the charge on the floating gate. Typically, a negative charge on the floating gate corresponds to a state referred to as "erased" (the logical value of the bit stored is, for example, "0"), whereas as positive charge on the floating gate corresponds to a state referred to as "programmed" (the logical value of the stored bit is, for example, "1").

Generally speaking, the selection transistor allows the access to the state transistor to be controlled. Its source is connected to the drain of the state transistor, and the source of the state transistor is connected to a source line.

SUMMARY

One embodiment provides a method for reading a memory cell of a memory plane of a memory of the erasable electrically-programmable ROM type. The word line and of the bit line to which the memory cell belongs are selected and the content of the cell is read via a read amplifier. One input of the read amplifier is connected to the bit line and pre-charged at a pre-charge voltage. During the read operation, a source voltage higher than the pre-charge voltage is applied to the source of the floating-gate transistor of the cell. A read current flows from the cell towards the input of the read amplifier and then flows through a programmed cell.

A memory device of the erasable electrically-programmable ROM type comprises a memory plane of memory cells. A read circuit comprises a read amplifier, one input of which is configured so as to be pre-charged at a pre-charge voltage. A controller is configured to select a word line and a bit line to which a cell belongs, so as to read the content of the cell via the read amplifier whose input is connected to the selected bit line. The controller is configured to apply a source voltage that is higher than the pre-charge voltage to the source of the floating-gate transistor of the cell. A read current flows from the cell towards the input of the read amplifier and then flows through a programmed cell.

BRIEF DESCRIPTION OF THE DRAWINGS

Other advantages and features of the invention will become apparent upon examining the detailed description of non-limiting embodiments and the appended drawings in which.

DETAILED DESCRIPTION OF ILLUSTRATIVE EMBODIMENTS

Figure 1:
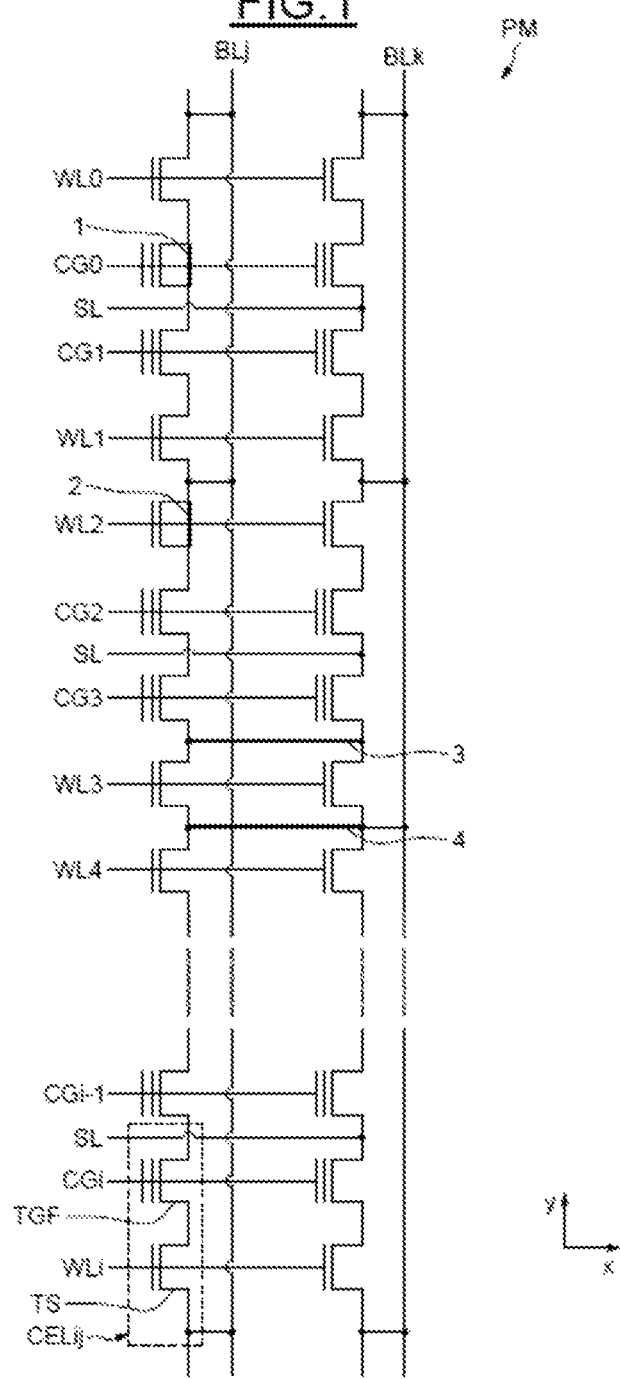
FIG. 1 illustrates one pattern of the structure of a memory plane of a memory of the EEPROM type.

A plurality memory cells can be distributed as a matrix in a memory plane. One periodic pattern of a memory plane is shown in FIG. 1. In this case, the memory cells are non-volatile memories of the electrically erasable and programmable type (EEPROM).

The access to a given memory cell CELij is achieved by virtue of a decoding of the memory plane PM. Each gate of the selection transistors TS is connected to a word line WLi which runs in the X direction of the memory plane, and each drain of the selection transistors TS is connected to a bit line BLj which runs in the Y direction of the memory plane.

The source lines SL are generally parallel to the word lines WLi.

Generally speaking, the bit lines are grouped into columns each comprising M bit lines.

The memory cells of the same word line connected to the M bit lines of a column then form a memory word allowing M bits to be stored.

The control gates of the state transistors TGF of the memory cells of a memory word, situated in a given column at the intersection with the row i, are controlled by the same control signal CGi, as shown in FIG. 1.

Thus, in order to read a data value stored by a memory cell, an input of a read amplifier is pre-charged at a pre-charge voltage. Then, a conventional decoding of the memory plane is carried out in such a manner as to select the memory cell.

The bit line is then pre-charged to the same voltage level as that of the input of the read amplifier, typically around 1V.

The pre-charge is halted and the decoded cell (selected) can be read by means of the read amplifier. The source line is at ground.

An erased cell does not allow the current to flow and the bit line remains at the pre-charged potential.

A programmed cell is conducting and allows the current to flow, which tends to make the voltage on the bit line drop.

The variation of the voltage is subsequently converted by the read amplifier into a logical value corresponding to the logical value of the bit stored in the selected memory cell.

There exists a constant need to increase the quantity of memory cells of a memory plane, in particular by reduction of the surface area occupied by a memory cell.

For reduced lengths, current leaks (referenced 1 and 2 in FIG. 1) in the selection and non-selected state transistors can occur notably because of a "short-channel effect". This is because a lowering of the potential barrier between the drain and the source takes place due to the extension of the space-charge region which comes close to the source, an effect which is more marked the shorter the channels. This barrier lowering results in the current leaks.

This effect leads to current flowing from the bit line towards the source line, usually connected to ground, through the non-selected memory cells.

The leaks associated with short-channel effects in the state transistors lead to instabilities in the read currents of the selected cells.

The leaks associated with short channel effects in the selection transistors mean that the bit-line current is equal to the read current of the selected cell, increased by the leakage currents of the selection transistors of non-selected cells, placed in series with their corresponding state transistors.

These leakage currents therefore depend on the logical state of the non-selected cells, hence are unpredictable. The reduction in the size of the memory cells in the Y direction is thus limited by the appearance of the current leaks associated with short-channel effects in the state transistors and the selection transistors.

On the other hand, the selection transistors of neighboring bit lines may have source and drain regions that are close, forming structures of the N/P/N type, typically isolated by shallow isolation trenches.

For reduced dimensions, it is then possible for current leaks 3, 4 to bypass the isolation trenches.

The current of the bit line is then also modified and can lead to read errors.

The reduction in the size of the memory cells in the X direction is thus limited by the appearance of current leaks 3, 4 between neighboring bit lines.

The current solutions with regard to read methods for reducing the current leaks do not allow the leaks associated with short-channel effects in the state and selection transistors to be prevented, and they do not handle well the leaks from one bit line to another.

According to one embodiment, a method is provided for reading a memory cell of the EEPROM type aiming to eliminate as far as possible the potential current leaks by short-channel effect in the state and selection transistors of the memory cells, together with the potential current leaks by diffusion of electrons between neighboring bit lines.

Thus, the method according to this embodiment notably allows memory cells with smaller dimensions to be formed and thus to increase the structural compactness of the memory planes of the memories of the EEPROM type.

According to one aspect, a method is provided for reading a memory cell of a memory plane of a memory of the erasable electrically-programmable ROM type, comprising a selection of the word line and of the bit line to which the memory cell belongs, and a reading of the content of the cell via a read amplifier, one input of which is connected to the bit line and pre-charged at a pre-charge voltage.

According to a general feature of this aspect, during the read operation, a source voltage higher than the pre-charge voltage is applied to the source of the floating-gate transistor of the cell, a read current flowing from the cell towards the input of the read amplifier then flowing through a programmed cell.

In other words, for a programmed cell, hence conducting, the read current flows in the opposite direction with respect to the prior art.

The potential barrier between the N/P/N junctions of the cells situated on neighbouring bit lines is increased by virtue of the reverse biasing of the source. The transfer of electrons is then virtually impossible and the leakage currents can be reduced by several orders of magnitude.

The memory cell can comprise a selection transistor whose source is connected to the drain of the floating-gate transistor, whose gate is connected to the word line and whose drain is connected to the input of the read amplifier via an auxiliary transistor configured for selecting the bit line, the substrates of the selection transistor and of the floating-gate transistor being connected to ground.

Thus, the voltage applied to the branches from which the leaks originate is always positive, and a "substrate effect" appears.

The substrate effect leads to a reduction in the leaks by increasing the potential barrier between source and drain of a transistor and between two closely-spaced bit lines.

According to one embodiment, and in the case of reading an erased cell, the voltage present at the input of the read amplifier is prevented from going below the pre-charge voltage.

It is indeed advantageous to keep the voltage at the input of the read amplifier positive in order to reduce, or even eliminate, the current leaks, in particular in the case of reading an erased cell, which has the tendency to make the voltage on the bit line drop.

The potential of the drain of an erased cell is the lowest potential applied to a diffusion N in the memory plane. If it is strictly positive, then all the diffusions N in the memory plane are at a strictly positive potential and the current leaks are consequently greatly reduced by substrate effect.

According to one embodiment, the pre-charge voltage is equal to a threshold voltage of an MOS transistor, the source voltage then being higher than the threshold voltage of an MOS transistor.

According to another aspect of the invention, a memory device of the erasable electrically-programmable ROM type, comprising a memory plane of memory cells, a read circuit comprising a read amplifier, one input of which is configured so as to be pre-charged at a pre-charge voltage, and a controller configured for selecting a word line and a bit line to which a cell belongs, so as to read the content of the cell through the read amplifier whose input is connected to the selected bit line.

According to a general feature of this other aspect, the controller is configured to apply to the source of the floating-gate transistor of the cell a source voltage higher than the pre-charge voltage, a read current flowing from the cell towards the input of the read amplifier then flows through a programmed cell.

The cell can comprise a selection transistor whose source is connected to the drain of the floating-gate transistor, whose gate is connected to the word line and whose drain is connected to the input of the read amplifier via an auxiliary transistor configured for selecting the bit line, the substrates of the selection transistor and of the floating-gate transistor being connected to ground.

The read amplifier is advantageously configured for drawing a current from the drain of the selection transistor to ground, this tending to make the drain voltage of the selection transistor of an erased cell tend towards 0. The pre-charge is then aimed at preventing this voltage from falling below a certain minimum value in order to provide the substrate effect.

In other words, according to one embodiment, the read amplifier is configured for preventing the voltage present at the input of the read amplifier from falling below the pre-charge voltage, in the case of reading an erased cell.

The read amplifier can be configured so that the pre-charge voltage is equal to a threshold voltage of an MOS transistor.

According to one embodiment, the read amplifier comprises a feedback loop containing a first MOS transistor in common source configuration whose drain is connected to the input of a second MOS transistor in source follower configuration, whose source is connected to the gate of the first MOS transistor and to the input of the read amplifier; the feedback loop is thus configured to prevent the voltage present at the input of the read amplifier from falling below the pre-charge voltage, which is moreover equal to the threshold voltage of the first MOS transistor.

The bit line is connected to the source of the transistor in source follower configuration.

The read amplifier comprises a current source imposing a current to ground on the pre-charge loop/bit-line assembly.

The various aspects and embodiments of the invention allow memory cells to be read while greatly reducing the current leaks, rendering possible a decrease in the surface area of the memory cells and thus an implementation of memory planes that are more compact than the current implementations.

Figure 2:
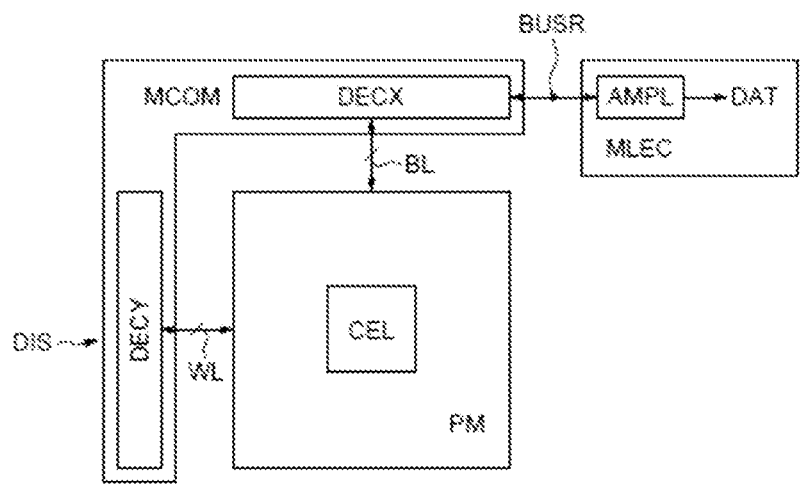
FIGS. 2 and 3 show various embodiments of a device according to the invention.

FIG. 2 illustrates a memory device DIS of the EEPROM type according to one embodiment of the invention. Elements that are not needed for the description and for the understanding of the invention have purposely not been shown.

The device DIS comprises a memory plane PM of memory cells CEL, with a structure similar to the structure described by FIG. 1, notably comprising bit lines BL and word lines WL.

A controller MCOM, comprising row decoders DECX and column decoders DECY, manages the access to the memory cells CEL by selecting the corresponding bit line BL and word line WL.

Thus, a selected cell is connected via a node BUSR to read circuit MLEC, notably to the input of a read amplifier AMPL whose output delivers a logical value DAT corresponding to the logical value of the bit stored in the selected memory cell.

Figure 3:
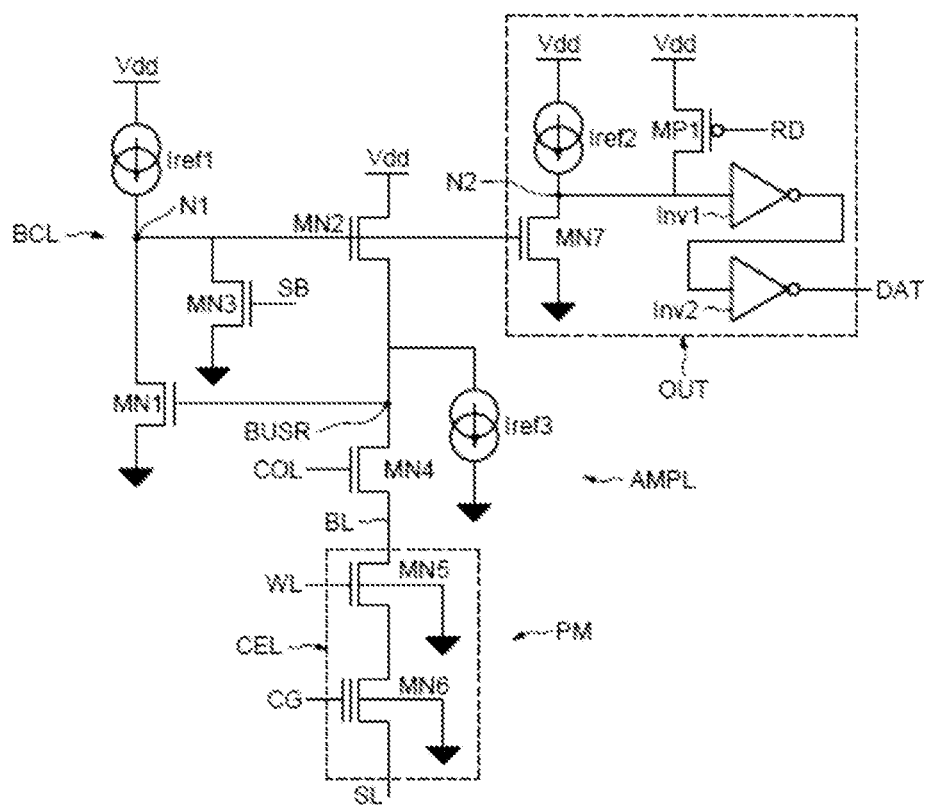

FIG. 3 shows, more precisely, one example of the various circuits in FIG. 2, in particular the read amplifier AMPL.

A cell CEL of a memory plane PM comprising a selection transistor MN5 and a floating-gate state transistor MN6 is notably shown.

A bit line BL is connected to the drain of the selection transistor MN5, a word line WL is connected to the gate of the selection transistor MN5, a control line CG is connected to the control gate of the state transistor MN6 and a source line SL is connected to the source of the state transistor MN6.

The substrates of the selection transistor MN5 and state transistor MN6 are connected to ground.

A transistor MN4 controlled on its gate by a signal COL connects the bit line BL to an input node BUSR of the read amplifier AMPL.

The transistor MN4 is an element of the controller MCOM allowing a bit line of the memory plane to be selected, as a function of the signal COL produced by the controller MCOM.

The read amplifier AMPL here comprises an output stage OUT and a feedback loop BCL connected to the input node BUSR of the read amplifier AMPL.

The feedback loop BCL notably comprises a first MOS transistor of the N type MN1 and a second MOS transistor of the N type MN2.

The source of the transistor MN1 is connected to ground, the drain of the transistor MN1 is connected to a current generator Iref1 via a node N1, and the gate of the transistor MN1 is connected to the input node BUSR of the amplifier AMPL. The current Iref1 is generated in such a manner as to be positive incoming into the drain of the transistor MN1.

The gate of the transistor MN2 is connected to the node N1, the drain of the transistor MN2 is connected to a stable positive voltage source Vdd, and the source of the transistor MN2 is connected to a stable current source Iref3 and to the input node BUSR. The current Iref3 is generated in such a manner as to be positive outgoing from the source of the transistor MN2.

In other words, the transistor MN1 is configured in common source mode and its drain is connected to the gate of the transistor MN2 configured in source follower mode, the source of the transistor MN2 being fed back onto the gate of the transistor MN1.

The bit line is connected, via the transistor MN4, to the input of the read amplifier.

Furthermore, a transistor MN3 controlled by a signal SB is connected to the node N1 and to ground.

The output stage OUT comprises an MOS transistor of the N type MN7 whose gate is connected to the node N1. The source of the transistor MN7 is connected to ground and its drain to a current generator Iref2 via a node N2. The current Iref2 is generated in such a manner as to be positive incoming onto the node N2.

The input of two inverters Inv1 and Inv2 in series is connected to the node N2 and the output of the inverters forms the output of the read amplifier AMPL, delivering the signal DAT.

Furthermore, a transistor of the P type MP1, controlled by a signal RD is connected to a stable positive voltage source Vdd and to the node N2.

The signals SB and RD are generated by the read circuit MLEC.

During a wait phase, the read amplifier is inactive, the voltage of the input node BUSR is floating, and the current sources are turned off.

The signal RD is at "0", so that the input of the inverters in series is forced to Vdd and is not therefore floating, the output signal DAT then being equal to "1".

The signal SB is at "1", so that the feedback loop BCL is "short-circuited" in order for the voltage of the input node BUSR of the amplifier AMPL to be floating, with the aim of limiting the power consumption.

The read phase is preceded by a pre-charge phase, during which the read amplifier is active and pre-charges the node BUSR to a pre-charge voltage.

When the bit line BL is not selected, the current source Iref3 applied to the node BUSR tends to make the voltage of the node BUSR fall below the threshold voltage of the transistor MN1.

The transistor MN1 is turned off, the voltage on the node N1 increases by the action of the current source Iref1 connected to a stable positive voltage source Vdd.

The transistor MN7 is then turned on but the voltage at the node N2 is held at Vdd by the conducting transistor MP1.

The source follower configuration of the transistor MN2 transmits an increasing voltage over the node BUSR until it reaches the threshold voltage of the transistor MN1, then making the voltage of the node N1 decrease. As a consequence, the voltage transmitted over the node BUSR by the source follower configuration of the transistor MN2 decreases in the same way until it reaches a stable situation.

This mechanism of the feedback loop BLC is stabilized when the voltage at the node BUSR is at the threshold voltage of the transistor MN1.

The pre-charge voltage therefore has the value of the threshold voltage of the transistor MN1, for example, substantially equal to 800 mV.

The controller MCOM selects the bit line BL by rendering the transistor MN4 conducting via a positive voltage COL, and the selected bit line is also pre-charged at the pre-charge voltage.

The signal RD is at "0" and DAT is still equal to "1".

During the read phase, the controller MCOM conventionally selects a memory cell by applying a positive voltage to the word line WL and by maintaining the transistor MN4 in the conducting state.

A voltage higher than the pre-charge voltage, for example, substantially equal to 1.4V, is applied to the source lines SL, and a positive reference potential is applied to the control gate CG.

Advantageously, the reference potential applied to the control gate CG is such that a virgin cell, in other words not carrying any charge in the floating gate of the state transistor, would deliver a voltage on the bit line equal to the pre-charge voltage if this reference voltage were applied to the control gate of its state transistor.

The reference voltage may, for example, be equal to 1.9V, but may also be equal to the voltage applied to the source line SL.

The current sources of the read amplifier AMPL are kept active, and the signals RD and SB are respectively equal to "1" and "0". The voltage at the node N2 is then generated by the voltage source Vdd via the current source Iref2 and depends on the conducting or non-conducting state of the transistor MN7.

The current source Iref3 imposes a current to ground on the pre-charge/bit-line feedback loop assembly. The bit line BL indeed needs to be pulled down to ground in order to be able to test the conduction state of the memory cell.

A memory cell in the erased state is non-conducting.

The mechanism of the feedback loop BCL previously described will bring the voltage of the node BUSR back to the level of the pre-charge voltage.

The voltage of the node N1 will increase in the course of this mechanism and render the transistor MN7 conducting, making the voltage of the node N2 drop. The signal DAT then goes to "0".

A memory cell in the programmed state is conducting and will transmit the voltage of the source line SL to the bit line BL and thus make the voltage of the node BUSR increase significantly. The transistor MN1 will be highly conducting, and will make the voltage at the node N1 drop and turn the transistor MN7 off.

The voltage of the node N2 then increases under the effect of the voltage source Vdd via the current source Iref2 and the signal DAT then goes to "1".

In this embodiment, the read operation is carried out by detection of a variation in voltage, but it may notably be envisaged to detect a variation in current.

In the read phase, a read current flows from the memory cell towards the input node BUSR of the read amplifier AMPL, and this read current cannot be higher than the current imposed by the current source Iref3.

Thus, the current source Iref3 may be configured for generating a current of low intensity, for example, substantially equal to 1 µA, allowing the invention to be adapted to systems with low power consumption.

Furthermore, the range of voltages on the bit line BL is limited by the threshold voltage of the transistor MN1 to the minimum and by the voltage applied to the source line SL to the maximum, also allowing the invention to be used in systems with low power consumption.

It turns out that, during the read operation, no current leakage due to a ground potential on a drain or a source of a transistor of the memory cells is able to interfere with the read current of the bit line.

This advantageous result comes notably from the introduction of the substrate effect (in other words the low level of the electrodes of the transistors is higher than ground) into all the possible passages of the current leaks.

It then becomes possible to reduce the lengths of the state and selection transistors of the memory cells, and also the space between two neighbouring bit lines of a memory plane, without however compromising the functionality of the memory owing to excessive current leaks.

By way of illustrative example, the present invention allows the surface areas of the memory cells currently used to be reduced by close to 50%.

Furthermore, the invention is not limited to the embodiment previously described but encompasses all its variants. For example, the output stage could comprise a differential amplifier, and the pre-charge voltage could be formed and maintained by any other means.

What is claimed is:

1. A method for reading a memory cell of a memory plane of a memory of the erasable electrically-programmable ROM type, the method comprising:
    selecting a word line and a bit line to which the memory cell belongs;
    pre-charging the bit line at a pre-charge voltage;
    performing a read operation to read information from the memory cell via a read amplifier that has an input coupled to the pre-charged bit line; and
    during the read operation, applying a source voltage higher than the pre-charge voltage to a source of a floating-gate transistor of the memory cell so that a read current flows from the memory cell towards the input of the read amplifier and then flows through a programmed cell.

2. The method according to claim 1, wherein the memory cell comprises a selection transistor that has a source connected to a drain of the floating-gate transistor, a gate connected to the word line, and a drain connected to the input of the read amplifier via an auxiliary transistor that is configured to select the bit line, wherein bodies of the selection transistor and of the floating-gate transistor are connected to ground.

3. The method according to claim 1, further comprising reading an erased cell of the memory plane, a voltage present at the input of the read amplifier being prevented from falling below the pre-charge voltage during the reading.

4. The method according to claim 3, wherein the pre-charge voltage is equal to a threshold voltage of an MOS transistor, the source voltage being higher than the threshold voltage of an MOS transistor.

5. A memory device of the erasable electrically-programmable ROM type, the memory device comprising:
    a memory plane of memory cells;
    a read circuit comprising a read amplifier that has an input configured to be pre-charged at a pre-charge voltage; and
    a controller configured to select a word line and a bit line to which a cell belongs, so as to read information from the memory cell via the read amplifier, which is coupled to the selected bit line, wherein the controller is configured to apply a source voltage higher than the pre-charge voltage to a source of a floating-gate transistor of the memory cell so that a read current flows from the memory cell towards the input of the read amplifier and then flows through a programmed cell.

6. The memory device according to claim 5, wherein the memory cell further comprises a selection transistor having a source coupled to a drain of the floating-gate transistor, a gate coupled to the selected word line, and a drain coupled to the input of the read amplifier via an auxiliary transistor configured for selecting the bit line.

7. The memory device according to claim 6, wherein a body of the selection transistor and a body of the floating-gate transistor are connected to ground.

8. The memory device according to claim 5, wherein the read amplifier is configured to prevent a voltage present at the input of the read amplifier from falling below the pre-charge voltage when reading an erased cell.

9. The memory device according to claim 8, wherein the read amplifier is configured so that the pre-charge voltage is equal to a threshold voltage of an MOS transistor.

10. The memory device according to claim 5, wherein the read amplifier comprises a feedback loop containing a common source configuration of a first MOS transistor in common source configuration, a drain of the first MOS transistor being connected to a gate of a second MOS transistor in source follower configuration and a source of the second MOS transistor being fed back onto a gate of the first MOS transistor and connected to the input of the read amplifier.

11. The memory device according to claim 10, wherein the feedback loop prevents a voltage present at the input of the read amplifier from falling below the pre-charge voltage.

12. The memory device according to claim 11, wherein the pre-charged voltage is equal to a threshold voltage of the first MOS transistor.

13. The memory device according to claim 10, wherein the read amplifier comprises a current source configured to impose a current to ground on the feedback loop and bit-line.

* * * * *